US012412878B2

(12) United States Patent
Hwang et al.

(10) Patent No.: US 12,412,878 B2
(45) Date of Patent: Sep. 9, 2025

(54) DISPLAY DEVICE USING MICRO LED AND METHOD FOR MANUFACTURING SAME

(71) Applicant: LG ELECTRONICS INC., Seoul (KR)

(72) Inventors: Sunghyun Hwang, Seoul (KR); Junghoon Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 689 days.

(21) Appl. No.: 17/638,281

(22) PCT Filed: Aug. 27, 2019

(86) PCT No.: PCT/KR2019/010886
§ 371 (c)(1),
(2) Date: Feb. 25, 2022

(87) PCT Pub. No.: WO2021/040066
PCT Pub. Date: Mar. 4, 2021

(65) Prior Publication Data
US 2022/0320057 A1    Oct. 6, 2022

(30) Foreign Application Priority Data

Aug. 26, 2019 (KR) .................. 10-2019-0104629

(51) Int. Cl.
H01L 25/16 (2023.01)
H10H 20/01 (2025.01)
(Continued)

(52) U.S. Cl.
CPC .......... H01L 25/167 (2013.01); H01L 25/165 (2013.01); H10H 20/013 (2025.01);
(Continued)

(58) Field of Classification Search
None
See application file for complete search history.

(56) References Cited

U.S. PATENT DOCUMENTS 10,516,084 B2 * 12/2019 Sasaki .................... H01L 33/58
10,784,405 B2 *  9/2020 Tak ....................... H01L 33/405
2013/0334552 A1 * 12/2013 Yang ...................... H01L 33/44
                                                          257/98

FOREIGN PATENT DOCUMENTS

CN    109314157    *  2/2019
JP    2008-130721      6/2008
(Continued)

OTHER PUBLICATIONS

PCT International Application No. PCT/KR2019/010886, International Search Report dated May 26, 2020, 9 pages.
(Continued)

Primary Examiner — Long Pham
(74) Attorney, Agent, or Firm — LEE, HONG, DEGERMAN, KANG & WAIMEY

(57) ABSTRACT

The present specification provides a semiconductor light emitting element having a new structure with a wider light emitting area than a conventional structure, when implementing a display device by using semiconductor light emitting elements. A semiconductor light emitting element according to one embodiment of the present invention is characterized by comprising: a first conductive-type semiconductor layer having a first side inclination angle; a second conductive-type semiconductor layer having a second side inclination angle, which is positioned on the first conductive-type semiconductor layer; and an active layer having a third side inclination angle, which is disposed between the first conductive-type semiconductor layer and
(Continued)

the second conductive-type semiconductor layer, wherein the second side inclination angle and the third side inclination angle are the same.

11 Claims, 24 Drawing Sheets

(51) Int. Cl.
*H10H 20/819* (2025.01)
*H10H 20/831* (2025.01)
*H01L 23/00* (2006.01)

(52) U.S. Cl.
CPC ........ *H10H 20/018* (2025.01); *H10H 20/819* (2025.01); *H10H 20/8314* (2025.01); *H01L 24/73* (2013.01); *H01L 24/92* (2013.01); *H01L 2224/73204* (2013.01); *H01L 2224/9211* (2013.01)

(56) References Cited

FOREIGN PATENT DOCUMENTS

| | | |
|---|---|---|
| JP | 2008525206 | 7/2008 |
| KR | 1020180130845 | 12/2018 |
| KR | 1020190009003 | 1/2019 |
| KR | 1020190085892 | 7/2019 |
| KR | 1020190096474 | 8/2019 |

OTHER PUBLICATIONS

Korean Intellectual Property Office Application No. 10-2019-0104629, Office Action dated Mar. 20, 2024, 8 pages.

\* cited by examiner

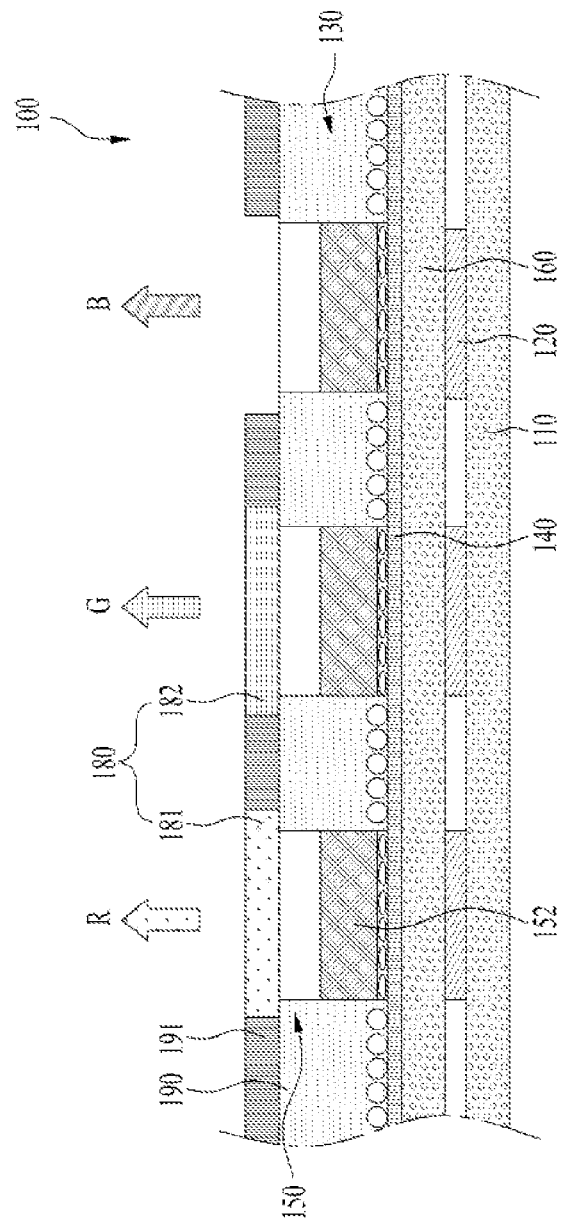

DISPLAY DEVICE USING MICRO LED AND METHOD FOR MANUFACTURING SAME

CROSS-REFERENCE TO RELATED APPLICATIONS

This application is the National Stage filing under 35 U.S.C. 371 of International Application No. PCT/KR2019/010886, filed on Aug. 27, 2019, which claims the benefit of earlier filing date and right of priority to Korean Application No. 10-2019-0104629, filed on Aug. 26, 2019, the contents of which are all hereby incorporated by reference herein in their entireties.

TECHNICAL FIELD

The present disclosure is applicable to the display device related technical fields and relates to a display device using a micro Light Emitting Diode (LED) and method for manufacturing the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

In order to implement a display device using these light emitting elements, a very large number of semiconductor light emitting elements is required. Therefore, considering manufacturing cost, the size of the respective semiconductor light emitting elements should be reduced so as to increase the number of semiconductor light emitting elements produced on a substrate having a given area.

However, as the size of the semiconductor light emitting elements is reduced, the quantity of light generated by the elements may be reduced, or it may be difficult to form wiring electrodes for electrically driving the semiconductor light emitting elements.

Accordingly, the present disclosure suggests a new type of semiconductor light-emitting element which may solve the above-descried problems.

DISCLOSURE

Technical Task

One technical task of the present disclosure is to provide a display device using a semiconductor light emitting element and a method for manufacturing the same.

Another technical task of the present disclosure is to provide a new type of semiconductor light emitting element which may minimize reduction in the quantity of light generated by the element even when the size of the semiconductor light emitting element is reduced.

Yet another technical task of the present disclosure is to provide a semiconductor light emitting element having a structure which facilitates formation of wiring electrodes for electrically driving the semiconductor light emitting element.

Yet another technical task of the present disclosure is to solve various problems not mentioned herein. Those skilled in the art may understand it through the full text of the specification and drawings.

Technical Solutions

In order to accomplish the above and other tasks, a display device using a semiconductor light emitting element according to one aspect of the present disclosure includes a substrate, assembly electrodes located on the substrate, an insulating layer located on the assembly electrodes, a partition wall located on the insulating layer so as to define an assembly recess configured such that the semiconductor light emitting element is assembled therewith, and the semiconductor light emitting element assembled with the assembly recess, wherein the semiconductor light emitting element includes a first conductivity-type semiconductor layer having a first side inclination angle, a second conductivity-type semiconductor layer having a second side inclination angle and located on the first conductivity-type, and an active layer having a third side inclination angle and disposed between the first conductivity-type semiconductor layer and the second conductivity-type semiconductor layer.

The second side inclination angle and the third side inclination angle may be equal.

A first area of the first conductivity-type semiconductor layer may be greater than a second area of the second conductivity-type semiconductor layer.

The semiconductor light emitting element may further include a first conductivity-type electrode located on an inclined side surface of the first conductivity-type semiconductor layer having the first side inclination angle, and a second conductivity-type electrode located on the second conductivity-type semiconductor layer.

The semiconductor light emitting element may further include a passivation layer configured to surround an inclined side surface of the active layer having the third conductivity-type semiconductor layer.

The passivation layer may be formed of amorphous Silicone (a-Si).

The first side inclination angle and the third side inclination angle may be equal.

The first side inclination angle may be greater than the third side inclination angle.

The display device may further include a first wiring electrode located on the first conductivity-type electrode, and the first wiring electrode may be electrically connected to the substrate.

The substrate may include a transistor configured to drive an active matrix, and the first conductivity-type electrode may be electrically connected to the transistor.

The semiconductor light emitting element may be a micro-LED having a size measured in micrometers.

A method for manufacturing a display device using a plurality of semiconductor light emitting elements according to another aspect of the present disclosure includes forming the semiconductor light emitting elements including an active layer having an inclined side surface part on a growth substrate, preparing an assembly substrate including assembly electrodes and assembly recesses, separating the semiconductor light emitting elements from the growth substrate and putting the separated semiconductor light emitting elements into a chamber filled with a fluid, placing the assembly substrate on an upper surface of the chamber and assembling the semiconductor light emitting elements with the assembly recesses of the substrate using a magnetic field and an electric field, and forming wiring electrodes configured to electrically connect the semiconductor light emitting elements assembled with the assembly recesses to the assembly substrate.

The forming the semiconductor light emitting elements may include sequentially stacking a first conductivity-type semiconductor layer, the active layer and a second conductivity-type semiconductor layer, and etching side surface parts of the semiconductor light emitting elements at designated inclination angles so that an area of the first conductivity-type semiconductor layer is greater than an area of the second conductivity-type semiconductor layer.

The etching the side surface parts of the semiconductor light emitting elements may include primarily etching the second conductivity-type semiconductor layer and the active layer at a first inclination angle, and secondarily etching the first conductivity-type semiconductor layer at a second inclination angle.

The forming the semiconductor light emitting elements may further include forming a passivation layer configured to surround exposed regions of the first conductivity-type semiconductor layer, the active layer and the second conductivity-type semiconductor layer.

A display device using a plurality of semiconductor light emitting elements according to yet another aspect of the present disclosure is configured such that at least one of the plurality of semiconductor light emitting elements includes a first conductivity-type semiconductor layer having a first side inclination angle, a second conductivity-type semiconductor layer having a second side inclination angle and located on the first conductivity-type, an active layer having a third side inclination angle and disposed between the first conductivity-type semiconductor layer and the second conductivity-type semiconductor layer, a first conductivity-type electrode located on an inclined side surface of the first conductivity-type semiconductor layer having the first side inclination angle, and a second conductivity-type electrode located on an upper surface of the second conductivity-type semiconductor layer, wherein the second side inclination angle and the third side inclination angle are equal.

Advantageous Effects

According to one embodiment of the present disclosure, a display device using a semiconductor light emitting element and a method for manufacturing the same may be provided.

Specifically, the semiconductor light emitting element including an active layer having an inclined side surface part is assembled on a substrate. The semiconductor light emitting element emits light also through the inclined side surface part thereof, and may thus have a wider emission area than a conventional semiconductor light emitting element having the same size.

Further, when wiring electrodes for driving the semiconductor light emitting element are formed, a distance between the wiring electrodes is increased proportional to the distance of the inclined side surface part, and thus, a wide wiring process margin may be acquired compared to the conventional semiconductor light emitting element, and a short-circuit defect between the wiring electrodes may be prevented.

Furthermore, according to another embodiment of the present disclosure, additional effects not mentioned herein may be exhibited. Those of ordinary skill in the art may understand it through the full text of the specification and drawings.

DESCRIPTION OF DRAWINGS

FIGS. 3A and 3B are cross-sectional diagrams taken along the cutting lines B-B and C-C in FIG. 2.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like. Furthermore, although the drawings are separately described for simplicity, embodiments implemented by combining at least two or more drawings are also within the scope of the present disclosure.

Figure 1:
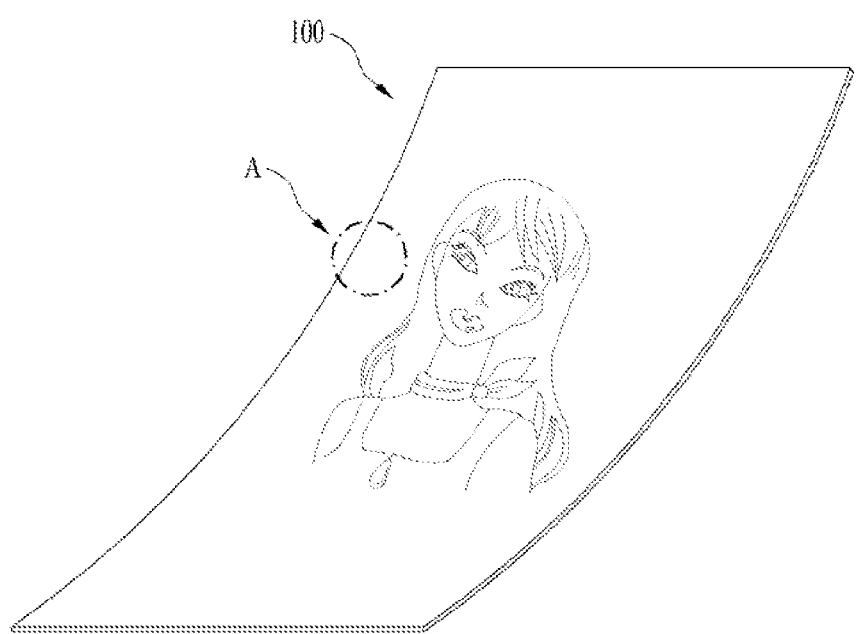
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
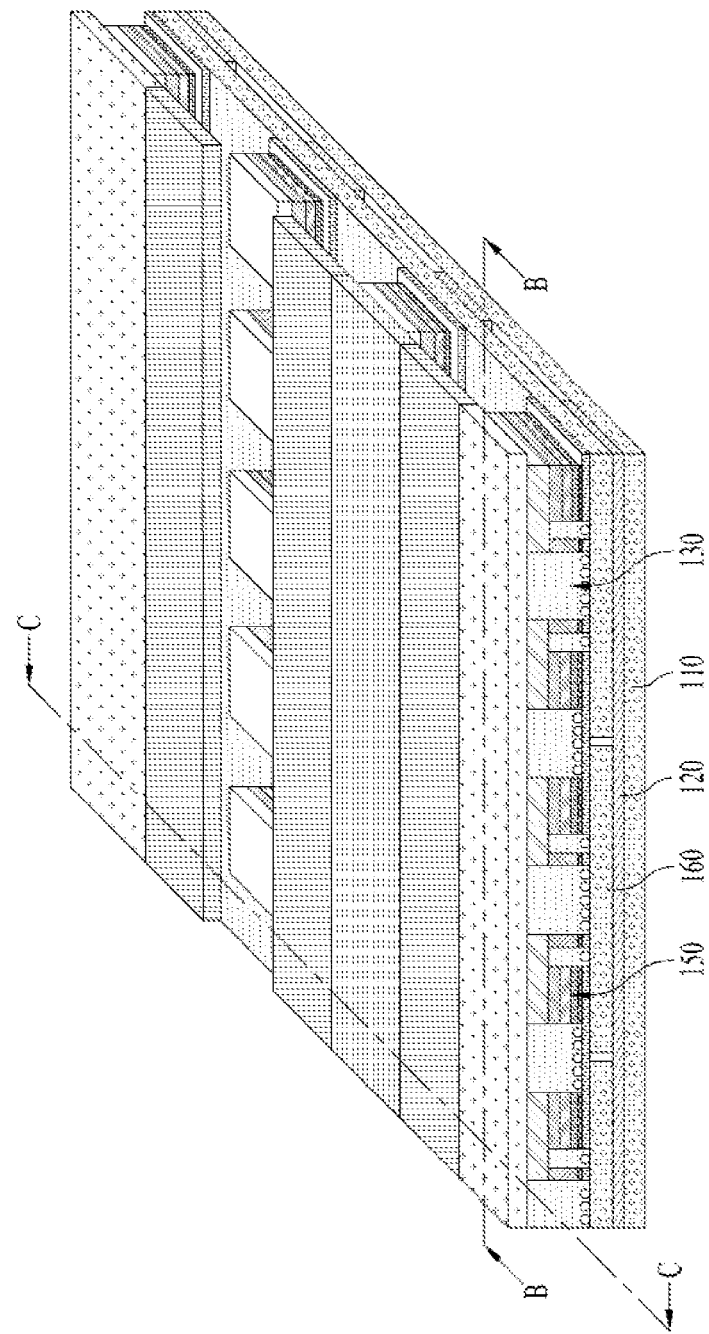
FIG. 2 is a partially enlarged diagram showing a part A shown in FIG. 1.

FIG. 2 is a partially enlarged view showing part A of FIG. 1.

Figure 3A:
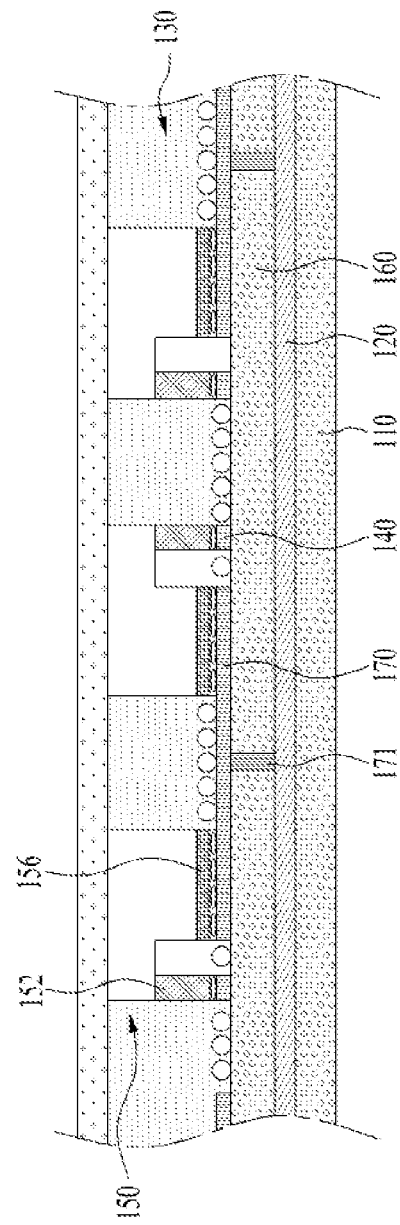

FIGS. 3A and 3B are cross-sectional views taken along lines B-B and C-C in FIG. 2.

Figure 4:
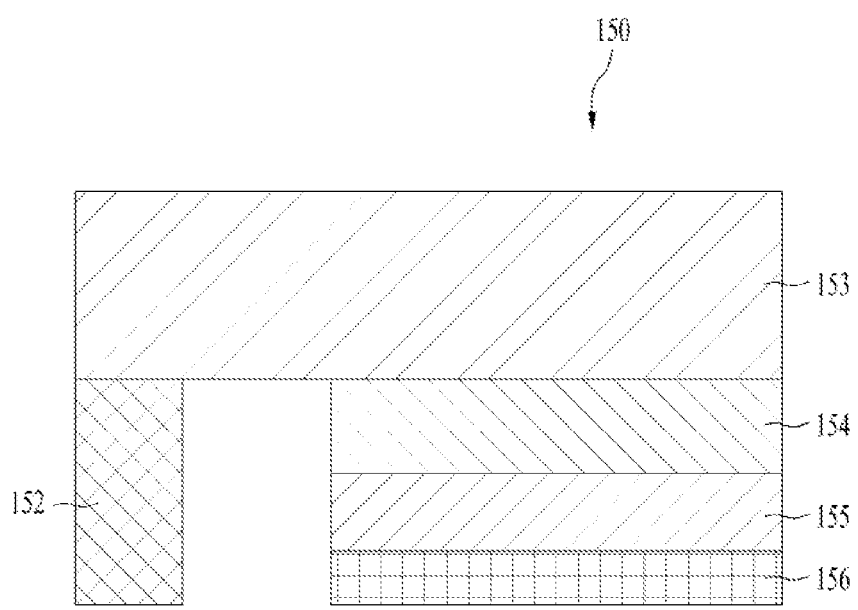
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
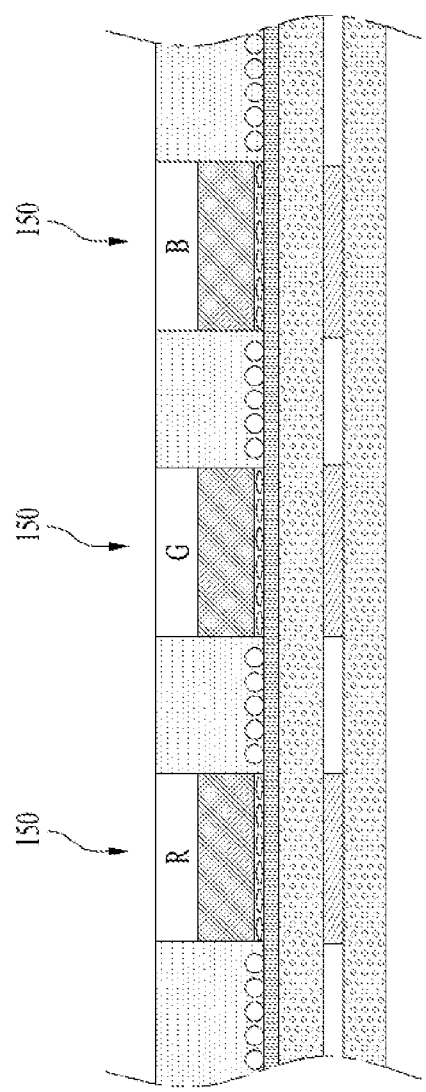
FIGS. 5A to 5C are conceptual diagrams illustrating various examples of color implementation with respect to a flip-chip type semiconductor light emitting element.
Figure 5B:
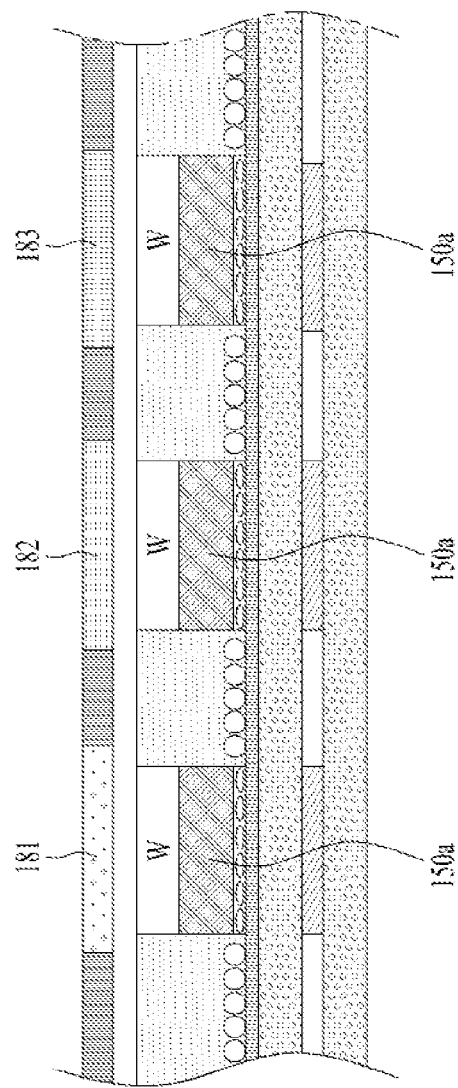
Figure 5C:
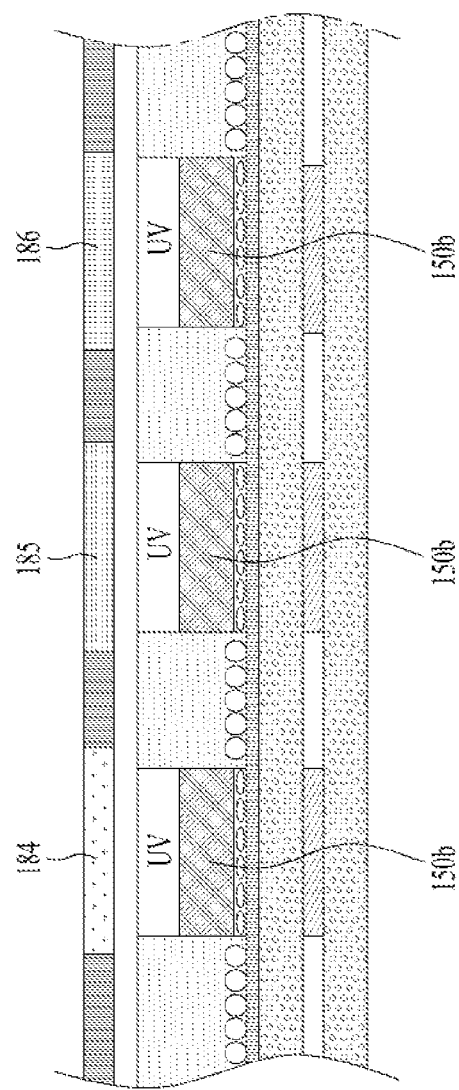

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to as simply a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150*a* may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on a ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
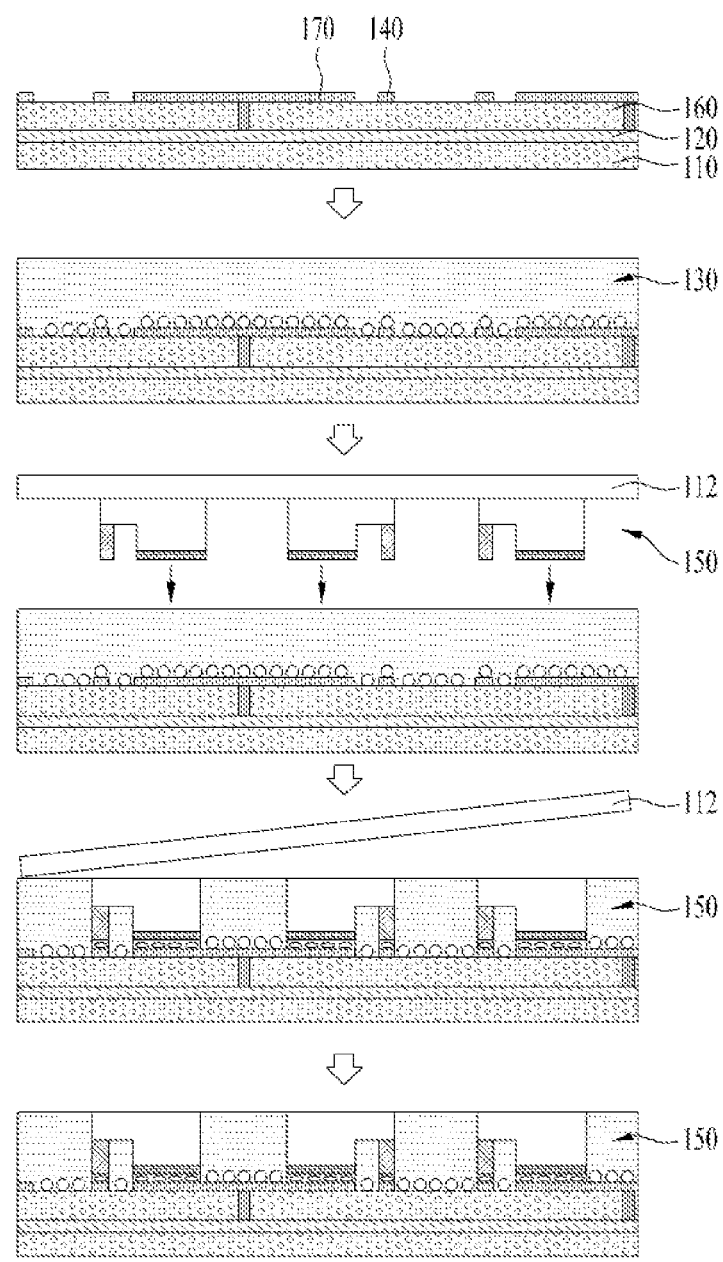
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
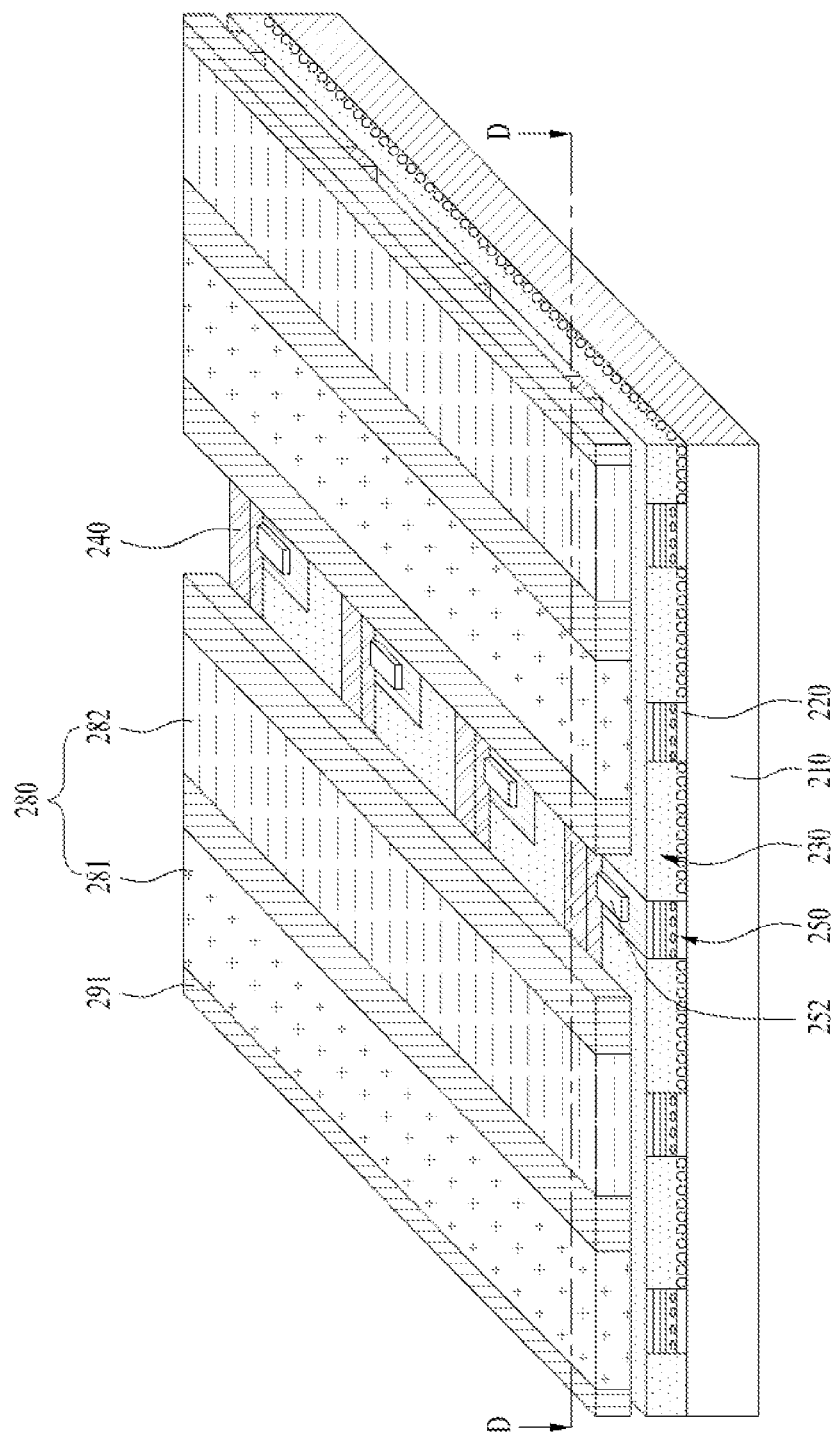
FIG. 7 is a perspective diagram of a display device using a semiconductor light emitting element according to another embodiment of the present disclosure.
Figure 8:
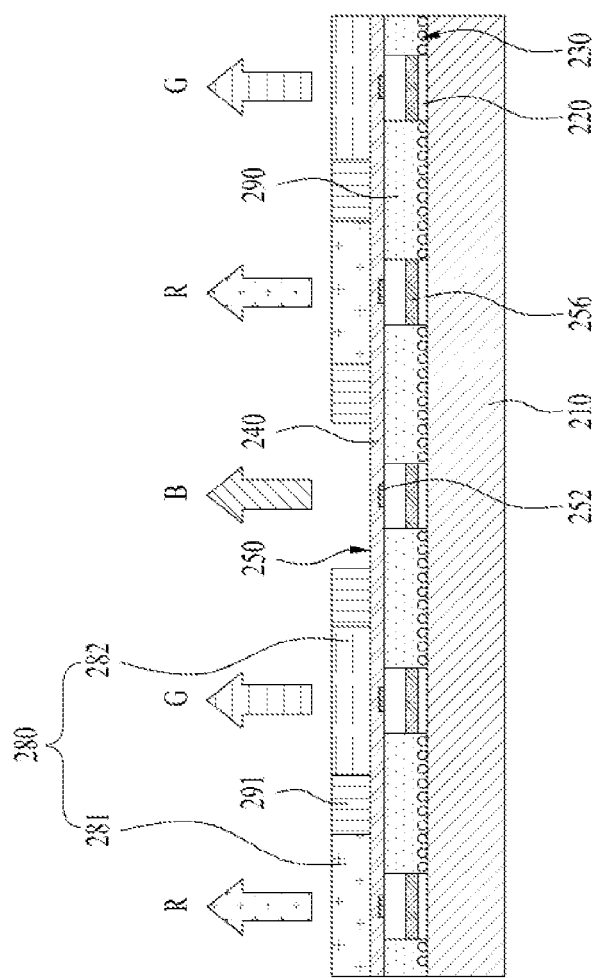
FIG. 8 is a cross-sectional diagram taken along a cutting line D-D shown in FIG. 8.
Figure 9:
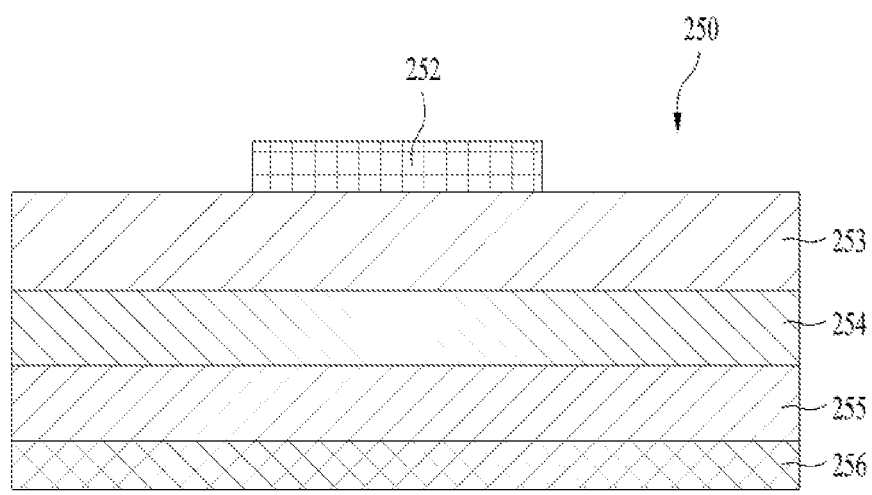
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

Figure 10:
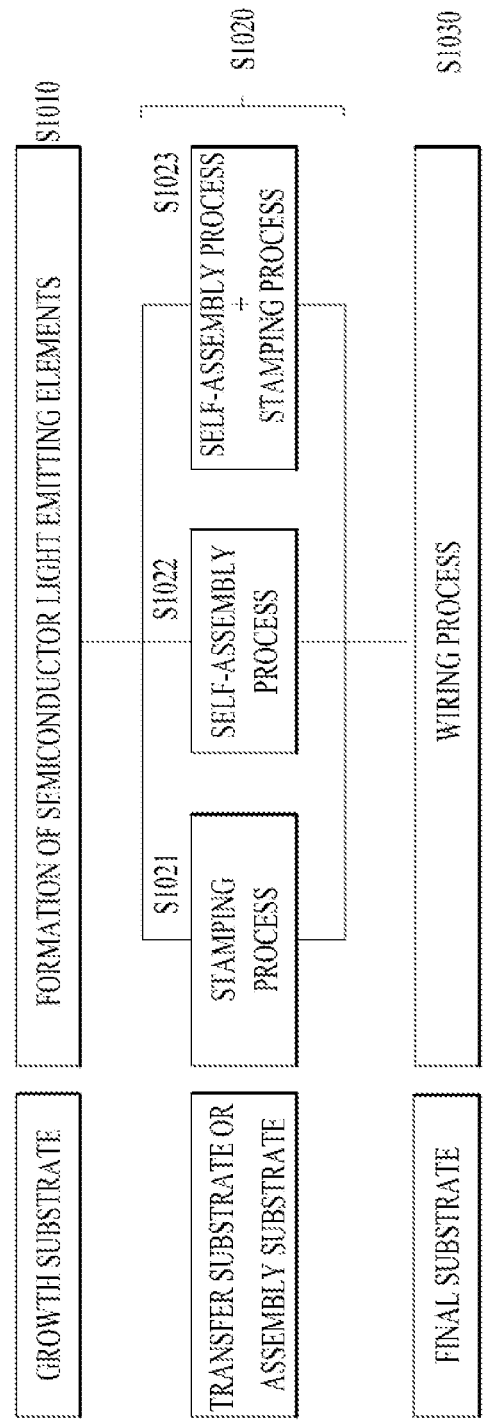
FIG. 10 is a flowchart schematically representing a method for manufacturing a display device using semiconductor light emitting elements.

FIG. 10 is a flowchart schematically representing a method for manufacturing a display device using semiconductor light emitting elements.

First, the semiconductor light emitting elements are formed on growth substrates (S1010). Each of the semiconductor light emitting elements may include a first conductivity-type semiconductor layer, an active layer and a second conductivity-type semiconductor layer. Each of the semiconductor light emitting elements may further include a first conductivity-type electrode formed on the first conductivity-type semiconductor layer and a second conductivity-type electrode formed on the second conductivity-type semiconductor layer.

The semiconductor light emitting elements may be horizontal semiconductor light emitting elements or vertical semiconductor light emitting elements. However, when the semiconductor light emitting elements are vertical semiconductor light emitting elements, the first conductivity-type electrode and the second conductivity-type electrode face each other, and thus, a process of separating the semiconductor light emitting elements from the growth substrate and then forming any one of the first and second conductivity-type electrodes in one direction is added. Further, as will be described later, the semiconductor light emitting elements may include a magnetic layer so as to perform the self-assembly process.

In order to apply the semiconductor light emitting elements to a display device, in general, three kinds of semiconductor light emitting elements configured to emit light of red (R), green (G) and blue (B) are necessary. Since semiconductor light emitting elements configured to emit light of one color are formed on one growth substrate, a separate substrate is required to manufacture the display device which implements respective unit pixels using the above three kinds of semiconductor light emitting elements. Therefore, the respective semiconductor light emitting elements need to be separated from the growth substrates and then be assembled on or transferred to a final substrate. The final substrate is a substrate on which a process of forming wiring electrodes applying voltage to the semiconductor light emitting elements so as to enable the semiconductor light emitting elements to emit light is performed.

Therefore, the semiconductor light emitting elements configured to emit light of respective colors may be primarily moved to a transfer substrate or an assembly substrate (S1020), and may be finally transferred to the final substrate. In some cases, when a wiring process is immediately performed on the transfer substrate or the assembly substrate, the transfer substrate or the assembly substrate may serve as the final substrate.

The semiconductor light emitting elements may be arranged on the transfer substrate or the assembly substrate by the following three methods (S1020).

First, the semiconductor light emitting elements may be transferred from the growth substrate to the transfer substrate by a stamping process (S1021). The stamping process indicates a process in which semiconductor light emitting elements are separated from a growth substrate using a substrate which is formed of a flexible material and has adhesive protrusions, through the protrusions. The semiconductor light emitting elements may be selectively separated from the growth substrate by controlling the distance between the protrusions and the arrangement of the protrusions.

Second, the semiconductor light emitting elements may be assembled with the assembly substrate using the self-assembly process, as described above (S1022). In order to perform the self-assembly process, the semiconductor light emitting elements should be separated from the growth substrate so as to be prepared individually, and thus, a number of the semiconductor light emitting elements corresponding to the number needed is separated from the growth substrates through a Laser Lift Off (LLO) process. Thereafter, the semiconductor light emitting elements are dispersed in fluid, and are assembled on the assembly substrate using an electromagnetic field.

In the self-assembly process, the respective semiconductor light emitting elements configured to implement light of R, G and B may be simultaneously assembled on one assembly substrate, or the semiconductor light emitting elements configured to implement light of the respective colors may be assembled through respective assembly substrates.

Third, both the stamping process and the self-assembly process may be used (S1023). First, the semiconductor light emitting elements are located on the assembly substrate through the self-assembly process, and then, the semiconductor light emitting elements are transferred to the final substrate through the stamping process. Since it is difficult to implement a large-area assembly substrate due to the position of the assembly substrate disposed during the self-assembly process, contact with the fluid, the effect of the electromagnetic field, etc., the semiconductor light emitting elements may be assembled on the assembly substrate having an appropriate area and then the semiconductor light emitting elements on the assembly substrate are transferred to the final substrate having a large area plural times through the stamping process.

When the plurality of semiconductor light emitting elements configured to form respective unit pixels is arranged on the final substrate, the wiring process in which the semiconductor light emitting elements are electrically interconnected is performed (S1030).

Wiring electrodes formed through the wiring process electrically connect the semiconductor light emitting elements, assembled on or transferred to the substrate, to the substrate. Further, transistors configured to drive an active matrix may be formed in advance on the lower surface of the substrate. Therefore, the wiring electrodes may be electrically connected to the transistors.

In order to implement a large-scale display device, a large number of semiconductor light emitting elements is required, and thus, the self-assembly process is desirable. Further, in order to improve assembly speed, simultaneous assembly of the semiconductor light emitting elements configured to emit light of respective colors on one assembly substrate may be preferred during the self-assembly process. Further, in order to assemble the semiconductor light emitting elements configured to emit light of the respective colors with predetermined positions of the assembly substrate, the semiconductor light emitting elements may require mutually exclusive structures.

Figure 11:
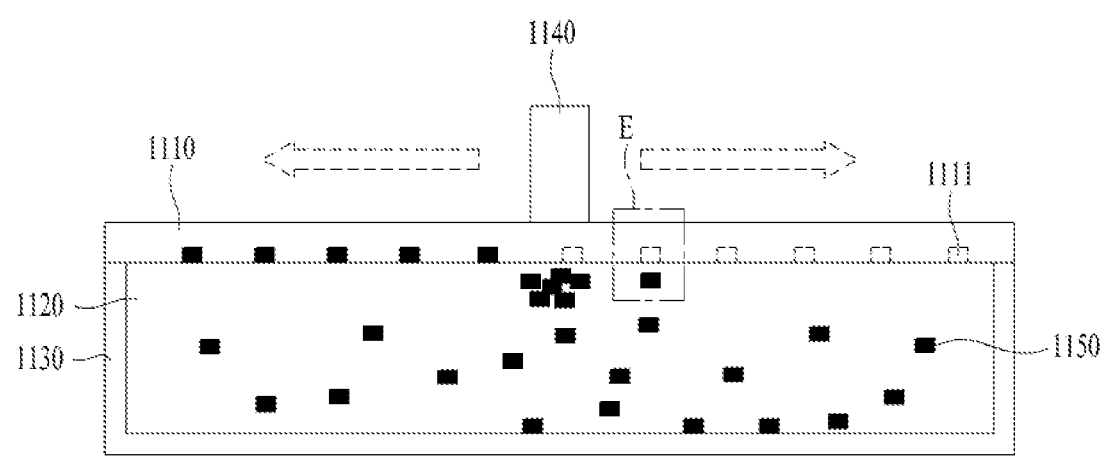
FIG. 11 is a diagram illustrating one embodiment of a method for assembling semiconductor light emitting elements on a substrate through a self-assembly process.

FIG. 11 is a diagram illustrating one embodiment of a method for assembling semiconductor light emitting elements on a substrate through the self-assembly process.

Figure 12:
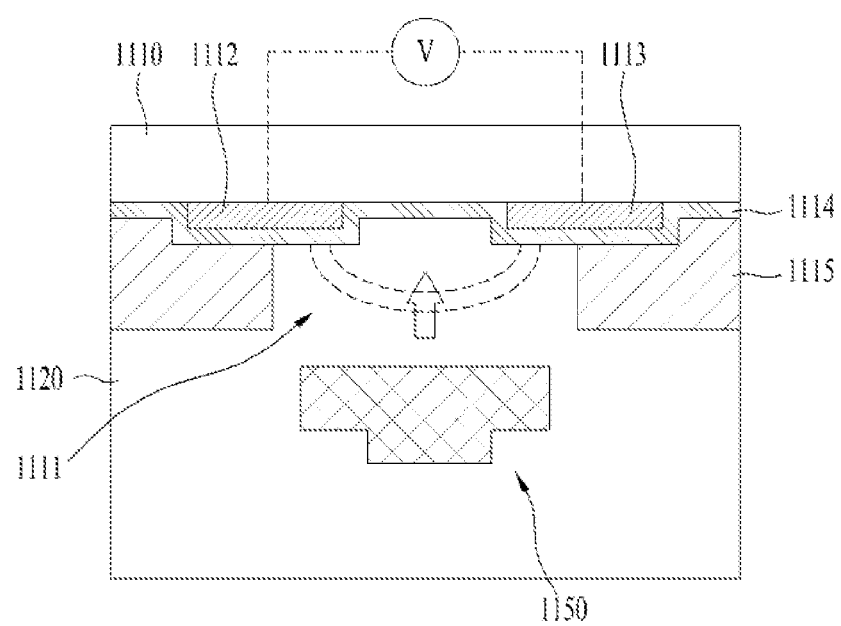
FIG. 12 is an enlarged diagram illustrating a part E shown in FIG. 11.

Further, FIG. 12 is an enlarged diagram illustrating a part E shown in FIG. 11.

Referring to FIGS. 11 and 12, semiconductor light emitting elements 1150 may be put into a chamber 1030 filled with a fluid 1020.

Thereafter, an assembly substrate 1110 may be placed on the chamber 1030. Depending on embodiments, the assembly substrate 1110 may be put into the chamber 1030. Here, the assembly substrate 1110 is put into the chamber 1030 in a direction in which assembly recesses 1111 of the assembly substrate 1110 face the fluid 1020.

A pair of electrodes 1112 and 1113 corresponding to each of the semiconductor light emitting elements 1150 to be assembled may be formed on the assembly substrate 1110. The electrodes 1112 and 1113 may be implemented as transparent electrodes (formed of ITO), or may be implemented using other general materials. The electrodes 1112 and 1113 may generate an electric field by voltage applied thereto, and may thus correspond to assembly electrodes which stably fix the semiconductor light emitting element 1050 coming into contact with the assembly electrodes 1112 and 1113.

Specifically, AC voltage may be applied to the electrodes 1112 and 1113, and the semiconductor light emitting element 1150 floating around the electrodes 1112 and 1113 may have polarity due to dielectric polarization. Further, the dielectrically polarized semiconductor light emitting element 1150 may be moved or fixed in a specific direction by a non-uniform electric field formed around the electrodes 1112 and 1113. This may be referred to as dielectrophoresis and, during the self-assembly process according to the present disclosure, the semiconductor light emitting elements 1150 may be stably fixed to the assembly recesses 1111 using dielectrophoresis.

Further, the distance between the assembly electrodes 1112 and 1113 may be less than, for example, the width of the semiconductor light emitting elements 1150 and the diameter of the assembly recesses 1111, and thus, the assembled positions of the semiconductor light emitting elements 1150 using an electric field may be more precisely fixed.

Further, an insulating layer 1114 may be formed on the assembly electrodes 1112 and 1113, and may thus protect the electrodes 1112 and 1113 from the fluid 1020 and prevent leakage of current flowing in the assembly electrodes 1112 and 1113. For example, the insulating layer 1114 may be formed as a single layer or multilayer structure using inorganic insulators, such as silica, alumina, etc., or organic insulators. In addition, the insulating layer 1114 may have a minimum thickness so as to prevent damage to the assembly electrodes 1112 and 1113 when the semiconductor light emitting elements 1150 are assembled with the assembly electrodes 1112 and 1113, and may have a maximum thickness so as to stably assemble the semiconductor light emitting elements 1150.

A partition wall 1115 may be formed on the insulting layer 1114. Some regions of the partition wall 1115 may be located on the assembly electrodes 1112 and 1113, and remaining regions may be located on the assembly substrate 1110.

For example, when the assembly substrate 1110 is manufactured, the assembly recesses 1111 through which the respective semiconductor light emitting elements 1150 are coupled to the assembly substrate 1110 may be formed by removing some parts of the partition wall 1115 formed on the entirety of the insulating layer 1114.

As shown in FIG. 12, the assembly recesses 1111 to which the semiconductor light emitting elements 1150 are coupled may be formed on the assembly substrate 1110, and the surface of the assembly substrate 1110 on which the assembly recesses 1111 are formed may come into contact with the fluid 1120. The assembly recesses 1111 may accurately guide the semiconductor light emitting elements 1150 to the assembly positions thereof.

Further, the partition wall 1115 may be formed to have a designated inclination in a direction from the opening of the assembly recess 1111 to the bottom surface of the assembly recess 1111. For example, through control of the inclination of the partition wall 1115, the assembly recess 1111 may have the opening and the bottom surface, and the area of the opening may be greater than the area of the bottom surface. Thereby, the semiconductor light emitting element 1150 may be assembled with the accurate position on the bottom surface in the assembly recess 1111.

Each of the assembly recesses 1111 may have a shape and a size corresponding to the shape of a corresponding one of the semiconductor light emitting elements 1150 assembled therewith. Accordingly, assembly of other semiconductor light emitting elements with the assembly recesses 1111 or assembly of a plurality of semiconductor light emitting elements with one of the assembly recesses 1111 may be prevented.

Further, the depth of the assembly recesses 1111 may be less than the vertical height of the semiconductor light emitting elements 1150. Therefore, the semiconductor light emitting elements 1150 may protrude from the partition wall 1115, and may easily come into contact with protrusions of a transfer substrate during a transfer process after assembly.

Further, after the assembly substrate 1110 is disposed, as shown in FIG. 12, an assembly apparatus 1140 including a magnetic body may be moved along the assembly substrate 1110. The assembly apparatus 1140 may be moved in the state in which the assembly apparatus 1140 comes into contact with the assembly substrate 1110, so as to maximize a region, which a magnetic field affects, up to the inside of the fluid 1120. For example, the assembly apparatus 1140 may include a plurality of magnetic bodies, or may include a magnetic body having a size corresponding to the size of the assembly substrate 1110. In this case, the moving distance of the assembly apparatus 1140 may be restricted to within a designated range.

By the magnetic field generated by the assembly apparatus 1140, the semiconductor light emitting elements 1150 in the chamber 1110 may be moved towards the assembly apparatus 1140.

While the semiconductor light emitting elements 1150 are moved towards the assembly apparatus 1140, the semiconductor light emitting elements 1150 may enter the assembly recesses 1111, and may thus come into contact with the assembly substrate 1110, as shown in FIG. 12.

Further, the semiconductor light emitting elements 1150 may include a magnetic layer formed therein so as to perform the self-assembly process.

Due to the electric field generated by the assembly electrodes 1112 and 1113 of the assembly substrate 1110, release of the semiconductor light emitting elements 1150 coming into contact with the assembly substrate 1110 from the assembly substrate 1110 by movement of the assembly apparatus 1140 may be prevented.

Therefore, by the self-assembly method using an electromagnetic field, as shown in FIGS. 11 and 12, the plurality of semiconductor light emitting elements 1150 may be simultaneously assembled on the assembly substrate 1110.

Figure 13:
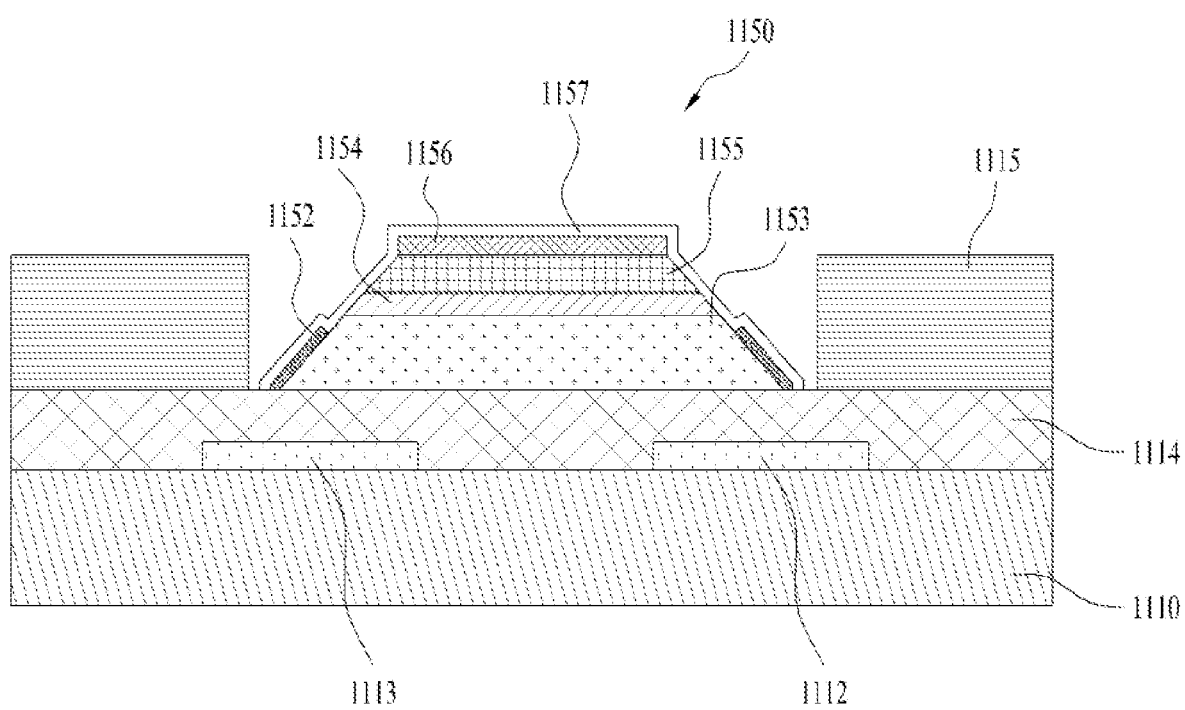
FIG. 13 is a cross-sectional diagram of the semiconductor light emitting element according to the present disclosure after the semiconductor light emitting element is assembled on the substrate through the self-assembly process.

FIG. 13 is a cross-sectional diagram of the semiconductor light emitting element according to the present disclosure after being assembled through the self-assembly process.

As shown in FIG. 13, when the self-assembly process has been completed, the semiconductor light emitting element 1150 is located in the assembly recess of the assembly substrate. The assembly substrate includes the assembly electrodes 1112 and 1113 configured to apply voltage to the substrate 1110, the insulating layer 1114 configured to protect the assembly electrodes 1112 and 1113, and the partition wall 1115 configured to form the assembly recesses.

Further, the semiconductor light emitting element 1150 may include a first conductivity-type semiconductor layer 1153, a second conductivity-type semiconductor layer 1155 located on the first conductivity-type semiconductor layer 1153, an active layer 1154 disposed between the first conductivity-type semiconductor layer 1153 and the second conductivity-type semiconductor layer 1154, a first conductivity-type electrode 1152 located on the inclined side surface part of the first conductivity-type semiconductor layer 1153, a second conductivity-type located on the upper surface of the second conductivity-type semiconductor layer 1155, and a passivation layer 1157.

The side surface part of the semiconductor light emitting element 1150 may have a designated inclination angle, and such an inclination angle may be varied depending on the respective conductivity-type semiconductor layers 1153 and 1155 and the active layer 1154.

Figure 14:
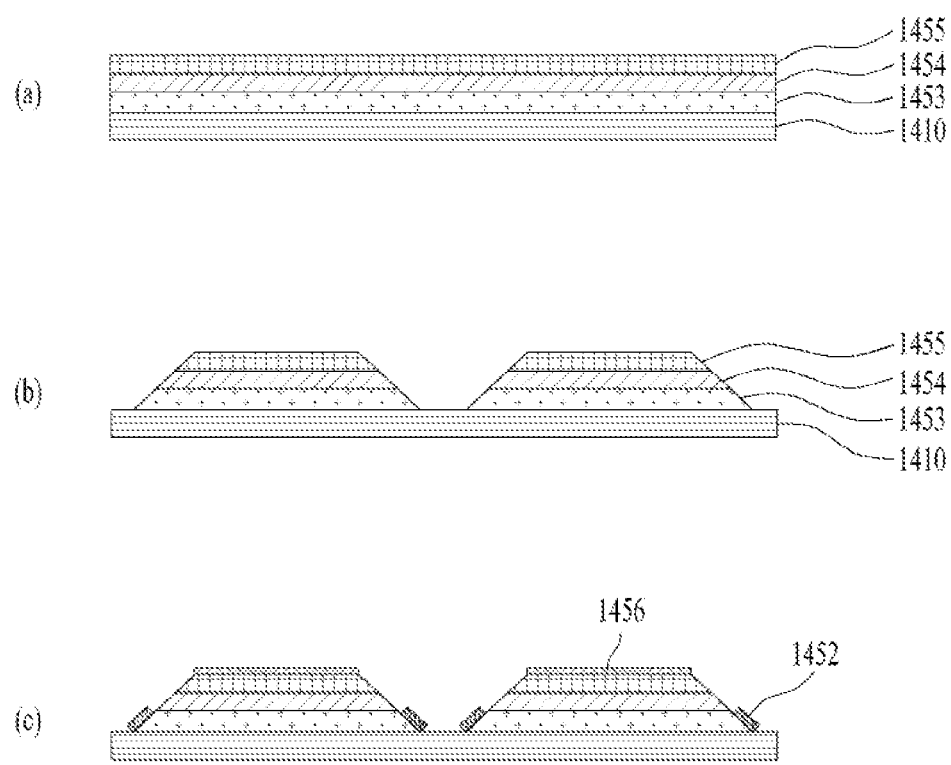
FIG. 14 shows diagrams illustrating a process of manufacturing semiconductor light emitting elements including an active layer having an inclined side surface part.

FIG. 14 shows diagrams illustrating a process of manufacturing semiconductor light emitting elements including an active layer having an inclined side surface part.

As shown in FIG. 14(*a*), a first conductivity-type semiconductor layer 1453, an active layer 1454 and a second conductivity-type semiconductor layer 1455 are formed on a growth substrate 1410.

Thereafter, as shown in FIG. 14(*b*), semiconductor light emitting structures including an inclined side surface part are formed on the growth substrate 1410 through an etching process. The semiconductor light emitting structures may be formed by etching such that the respective side surface parts of the first conductivity-type semiconductor layer 1453, the active layer 1454 and the second conductivity-type semiconductor layer 1455 may have the same inclination angle. Through such etching, the first conductivity-type semiconductor layer 1453 may have a wider area than the second conductivity-type semiconductor layer 1455 in the stacking direction of the semiconductor light emitting structure.

Otherwise, the respective side surface parts of the first conductivity-type semiconductor layer 1453, the active layer 1454 and the second conductivity-type semiconductor layer 1455 may be etched to have different inclination angles. However, the active layer 1454 is generally formed to have a thickness not exceeding 1 μm, and formation of an independent side inclination angle of the active layer having a thickness of equal to or less than 1 μm may be ineffective in terms of processes. Therefore, it is advantageous in terms of processes to etch the active layer so as to have the same inclination angle as the second conductivity-type semiconductor layer 1455. Therefore, for example, during the etching process, a first etching operation in which the second conductivity-type semiconductor layer 1455 and the active layer 1454 are etched at a first inclination angle and a second etching operation in which the first conductivity-type semiconductor layer 1453 is etched at a second inclination angle may be performed. In this case, it is advantageous in terms of the emission area of the semiconductor light emitting element that the second inclination angle is greater than the first inclination angle so as to increase the area of the active layer as much as possible.

Thereafter, as shown in FIG. 14(*c*), a first conductivity-type electrode 1452 electrically connected to the first conductivity-type semiconductor layer and a second conductivity-type electrode 1456 electrically connected to the second conductivity-type semiconductor layer may be formed. The first conductivity-type electrode 1452 may be formed on the inclined side surface part of the first conductivity-type semiconductor layer.

Meanwhile, the second conductivity-type electrode 1456 may be formed on the upper surface of the second conductivity-type semiconductor layer. The second conductivity-type electrode 1456 may be a transparent electrode formed of ITO, and thus, light generated by the active layer may pass through the second conductivity-type semiconductor layer and the second conductivity-type electrode 1456 and then be emitted to the outside of the semiconductor light emitting element. Further, the second conductivity-type electrode 1456 may be stacked in the operation shown in FIG. 14(*a*) in which the respective conductivity-type semiconductor layers and the active layer are stacked. That is, a second conductivity-type electrode layer may be formed on the second conductivity-type semiconductor layer, and thereafter, the second conductivity-type electrode 1456 having a designated shape may be formed through the etching process, as shown in FIG. 14(*c*).

Figure 15:
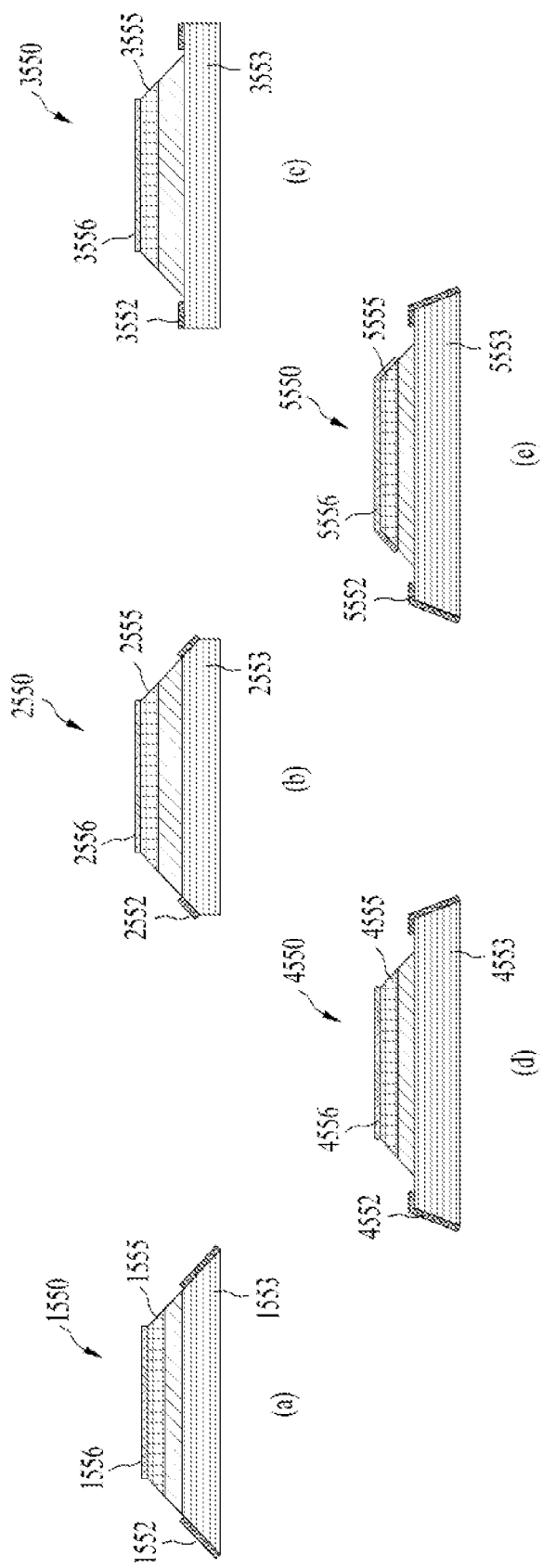
FIG. 15 shows diagrams illustrating semiconductor light emitting elements having various side inclination angles and conductivity electrodes formed thereby according to various embodiments of the present disclosure.

FIG. 15 shows diagrams illustrating semiconductor light emitting elements having various side inclination angles and conductivity electrodes formed thereby according to various embodiments of the present disclosure.

First, as shown in FIG. 15(*a*), a first conductivity-type electrode 1552 may be formed on the inclined surface of a first conductivity-type semiconductor layer 1553 of a semiconductor light emitting element 1550, and a second conductivity-type electrode 1556 may be formed on the upper surface of a second conductivity-type semiconductor layer 1555. As shown in FIG. 15(*a*), the side surface part of the semiconductor light emitting element 1550 may have a single inclination angle.

Further, as shown in FIG. 15(*b*), a first conductivity-type electrode 2552 may be formed on the inclined surface of a first conductivity-type semiconductor layer 2553 of a semiconductor light emitting element 2550, and a second conductivity-type electrode 2556 may be formed on the upper surface of a second conductivity-type semiconductor layer 2555.

A portion of the side surface part of the first conductivity-type semiconductor layer 2553 of the semiconductor light emitting element 2550 may have the same inclination angle as the side surface part of the second conductivity-type semiconductor layer 2555, and the remainder of the side surface part of the first conductivity-type semiconductor layer 2553 may be etched to be perpendicular to the stacking direction of the semiconductor layers.

Further, as shown in FIG. 15(*c*), a first conductivity-type electrode 3552 may be formed on the exposed upper surface of a first conductivity-type semiconductor layer 3553 of a semiconductor light emitting element 3550, and a second conductivity-type electrode 3556 may be formed on the upper surface of a second conductivity-type semiconductor layer 3555.

In the semiconductor light emitting element 3550, parts of the second conductivity-type semiconductor layer 3555 and the active layer may be etched at a designated inclination angle, and the first conductivity-type semiconductor layer 2553 exposed through the etching process may be formed to be horizontal with the stacking direction of the semiconductor layers.

Further, as shown in FIG. 15(*d*), a first conductivity-type electrode 4552 may be formed on the exposed upper surface and the inclined side surface of a first conductivity-type semiconductor layer 4553 of a semiconductor light emitting element 4550, and a second conductivity-type electrode 4556 may be formed on the upper surface of a second conductivity-type semiconductor layer 4555.

The inclination angle of the side surface of the first conductivity-type semiconductor layer 4553 of the semiconductor light emitting element 4550 may be different from the inclination angle of the side surface of the second conductivity-type semiconductor layer 4555. For example, the inclination angle of the side surface of the first conductivity-type semiconductor layer 4553 may be greater than the inclination angle of the side surface of the second conductivity-type semiconductor layer 4555.

Further, as shown in FIG. 15(*e*), a first conductivity-type electrode 5552 may be formed on the exposed upper surface and the inclined side surface of a first conductivity-type semiconductor layer 5553 of a semiconductor light emitting element 4550, and a second conductivity-type electrode 4556 may be formed on the upper surface and the inclined side surface of a second conductivity-type semiconductor layer 5555.

However, the present disclosure is not limited to the embodiments mentioned in FIG. 15, various other side surface inclination angles and conductivity-type electrodes formed thereby may be provided within a range easily deduced by those skilled in the art.

Figure 16:
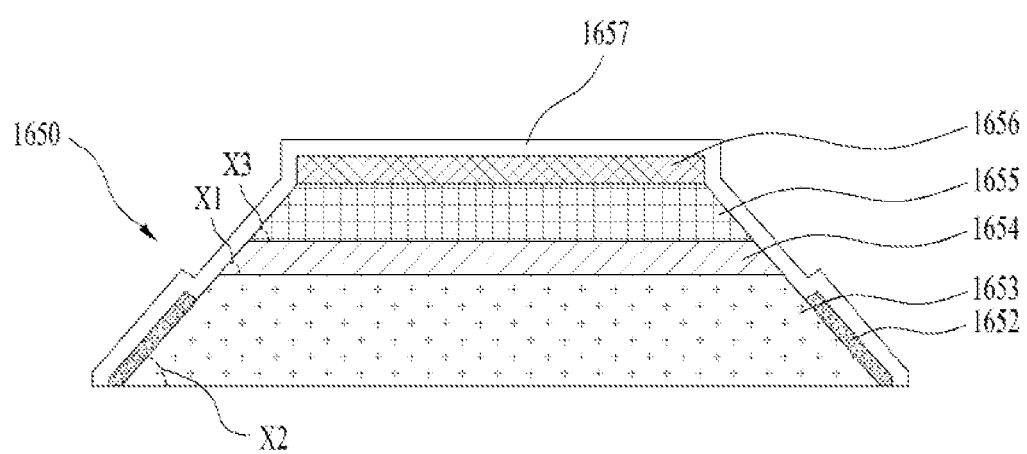
FIG. 16 is a diagram specifically illustrating the structure of a semiconductor light emitting element according to the present disclosure.

FIG. 16 is a diagram specifically illustrating the structure of a semiconductor light emitting element according to the present disclosure.

The semiconductor light emitting element shown in FIG. 16 additionally includes a passivation layer 1657 configured to surround exposed regions of the first conductivity-type semiconductor layer, the active layer, the second conductivity-type semiconductor layer, the first conductivity-type electrode and the second conductivity-type electrode of the semiconductor light emitting structure having the conductivity-type electrodes shown in FIG. 14(*c*). The passivation layer 1657 may be formed before the semiconductor light emitting element is separated from a growth substrate, and a separate passivation layer may be formed on the lower portion of the semiconductor light emitting element after the semiconductor light emitting element is separated from the growth substrate.

In more detail, the semiconductor light emitting element 1650 includes a first conductivity-type semiconductor layer 1653, a second conductivity-type semiconductor layer 1655 located on the first conductivity-type semiconductor layer 1653, an active layer 1654 disposed between the first conductivity-type semiconductor layer 1653 and the second conductivity-type semiconductor layer 1655, a second conductivity-type electrode 1656 located on the second conductivity-type semiconductor layer 1655, a first conductivity-type electrode 1652 located on the side surface part of the first conductivity-type semiconductor layer 1653 having a designated inclination angle formed by etching parts of the second conductivity-type semiconductor layer 1655, the active layer 1654 and the first conductivity-type semiconductor layer 1653, and the passivation layer 1657 configured to surround the upper and side surfaces of the semiconductor light emitting structure.

The active layer 1654 of the semiconductor light emitting element 1650 may have a side surface part having a first inclination angle X1 with respect to the stacking direction of the semiconductor light emitting element.

In addition, the first conductivity-type semiconductor layer 1653 of the semiconductor light emitting element 1650 may have a side surface part having a second inclination angle X2 with respect to the stacking direction of the semiconductor light emitting element.

Further, the second conductivity-type semiconductor layer 1655 of the semiconductor light emitting element 1650 may have a side surface part having a third inclination angle X3 with respect to the stacking direction of the semiconductor light emitting element.

Although FIG. 16 illustrates the inclination angles X1 to X3 are constant, the present disclosure is not limited thereto, and these inclination angles may be different through the etching process.

Figure 17:
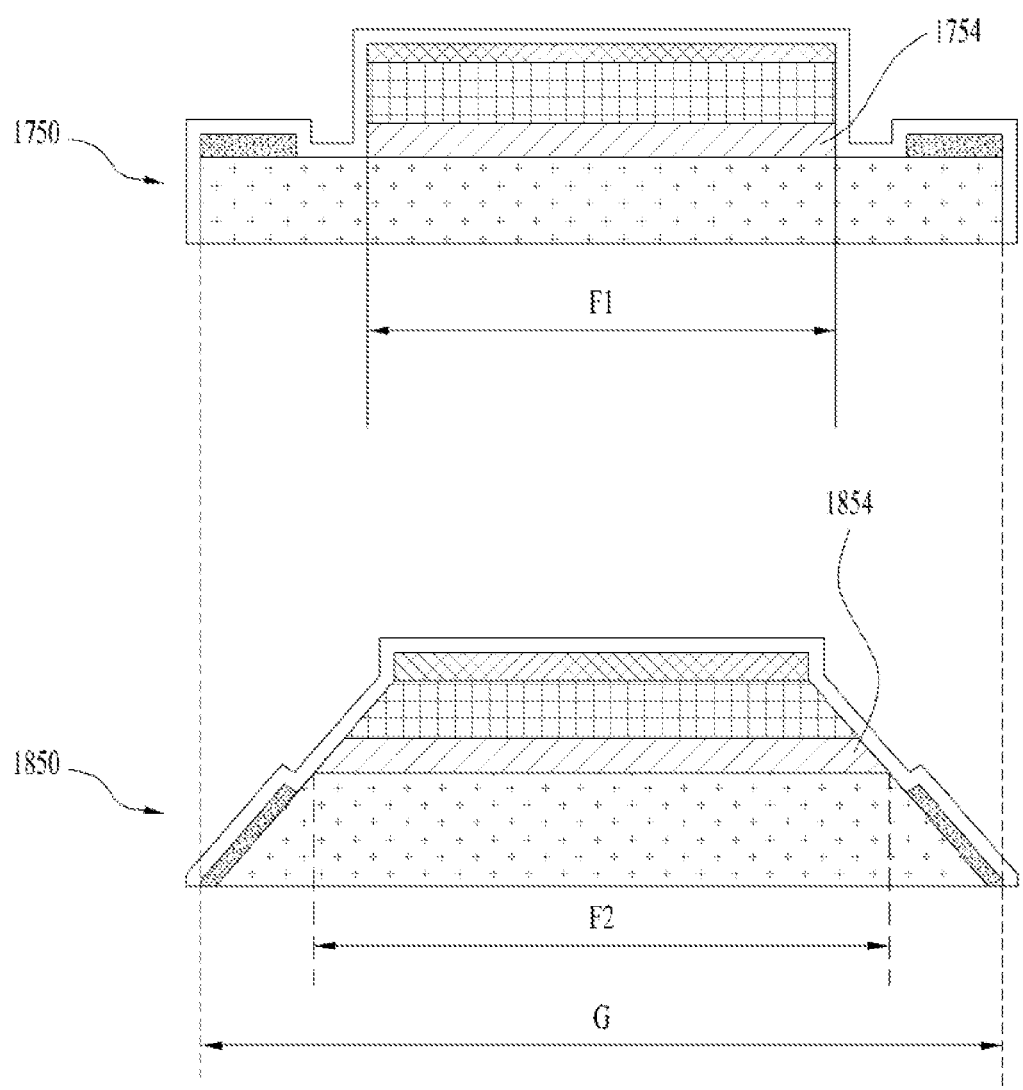
FIG. 17 shows cross-sectional diagrams comparatively illustrating the emission area of a semiconductor light emitting element according to the present disclosure and the emission area of a semiconductor light emitting element having a conventional structure.

FIG. 17 shows cross-sectional diagrams comparatively illustrating the emission area of a semiconductor light emitting element according to the present disclosure and the emission area of a semiconductor light emitting element having a conventional structure.

FIG. 17(*a*) illustrates a semiconductor light emitting element 1750 having a conventional structure. A factor to determine the emission area of the semiconductor light emitting element 1750 is the area of an active layer 1754. For example, according to the cross-sectional diagram shown in FIG. 17(*a*), the emission area of the semiconductor light emitting element 1750 is determined in proportion to the diameter F1 of the active layer 1754.

On the other hand, FIG. 17(*b*) illustrates a semiconductor light emitting element 1850 according to the present disclosure. The side surface part of an active layer 1854 of the semiconductor light emitting element 1850 has an inclined surface, and thus, the emission area of the semiconductor light emitting element 1850 may be determined in proportion to the diameter F2 of the lower part of the active layer 1854.

Therefore, in comparison between the semiconductor light emitting elements 1750 and 1850 shown in FIGS. 17(*a*) and 17(*b*), the semiconductor light emitting elements 1750 and 1850 may have the same size in proportion to the overall diameter G thereof (i.e., the lower parts of the semiconductor light emitting elements except for the passivation layers thereof may have the same area), but the emission areas thereof are not the same due to a difference between the diameters F1 and F2.

Figure 18:
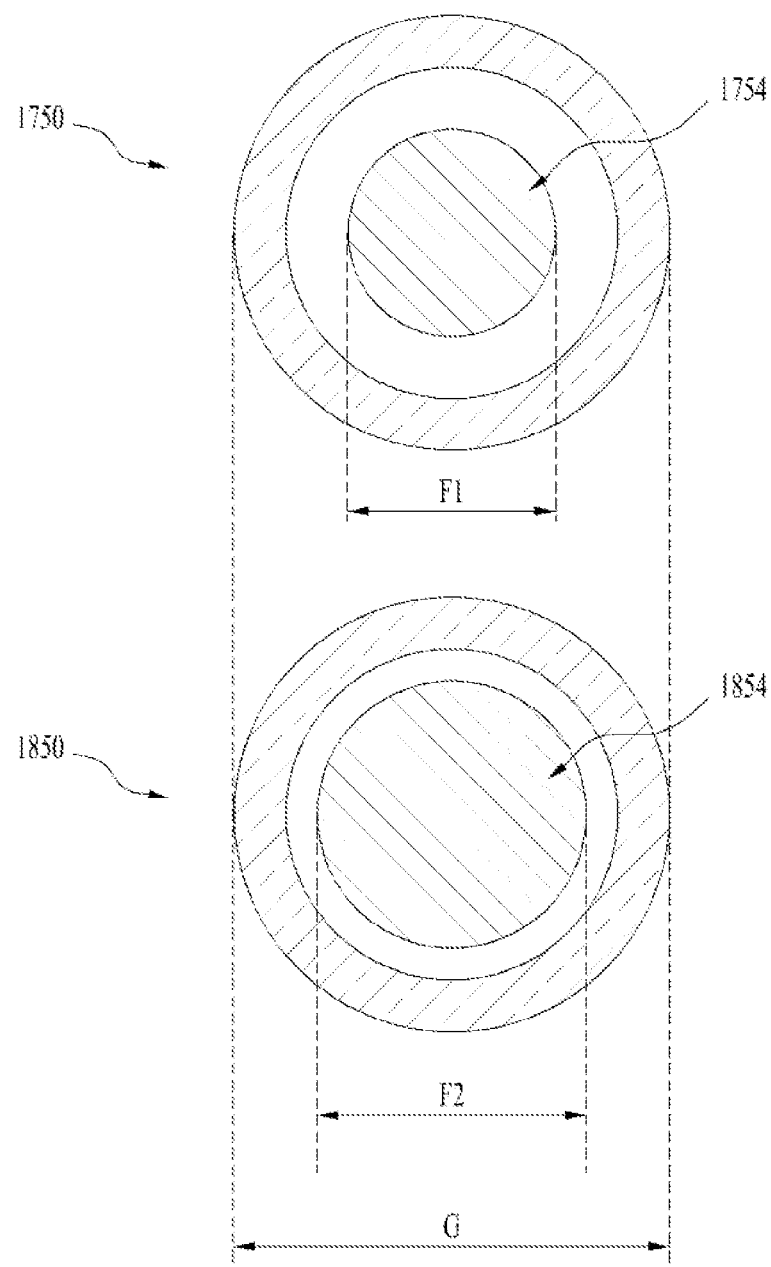
FIG. 18 shows plan diagrams comparatively illustrating the emission area of the semiconductor light emitting element according to the present disclosure and the emission area of the semiconductor light emitting element having the conventional structure.

FIG. 18 shows plan diagrams comparatively illustrating the emission area of the semiconductor light emitting element according to the present disclosure and the emission area of the semiconductor light emitting element having the conventional structure.

FIG. 18 shows that the semiconductor light emitting element 1850, in which the side surface part of the active layer has an inclined structure, as shown in FIG. 17, has an increased emission area compared to the conventional semiconductor light emitting element 1750.

As shown in FIG. 18, the diameter F2 of the active layer 1854 of the semiconductor light emitting element 1850 according to the present disclosure is greater than the diameter F1 of the active layer 1754 of the conventional semiconductor light emitting element 1750, and thus, when the semiconductor light emitting element according to the present disclosure is driven, the emission area thereof is increased proportional to such a diameter difference.

For example, as shown in FIG. 18, when the semiconductor light emitting element 1850 according to the present disclosure and the semiconductor light emitting element 1750 having the conventional structure are the same type of circular semiconductor light emitting elements having the same diameter G, the emission area of the semiconductor light emitting element 1850 according to the present disclosure is increased by $\{(F2/2)2\times\pi-(F1/2)2\times\pi\}$, compared to the semiconductor light emitting element 1750 having the conventional structure. Here, $\pi$ indicates the ratio of the circumference of a circle to its diameter.

As described above, in order to implement an ultra-high-pixel and large-scale display device, the size of semiconductor light emitting elements needs to reduced, and thereby, the size of the emission areas of the semiconductor light emitting elements is also reduced. In this respect, the semiconductor light emitting structure according to the present disclosure is advantageous in that the emission area of a semiconductor light emitting element having a given size may be maximized.

Figure 19:
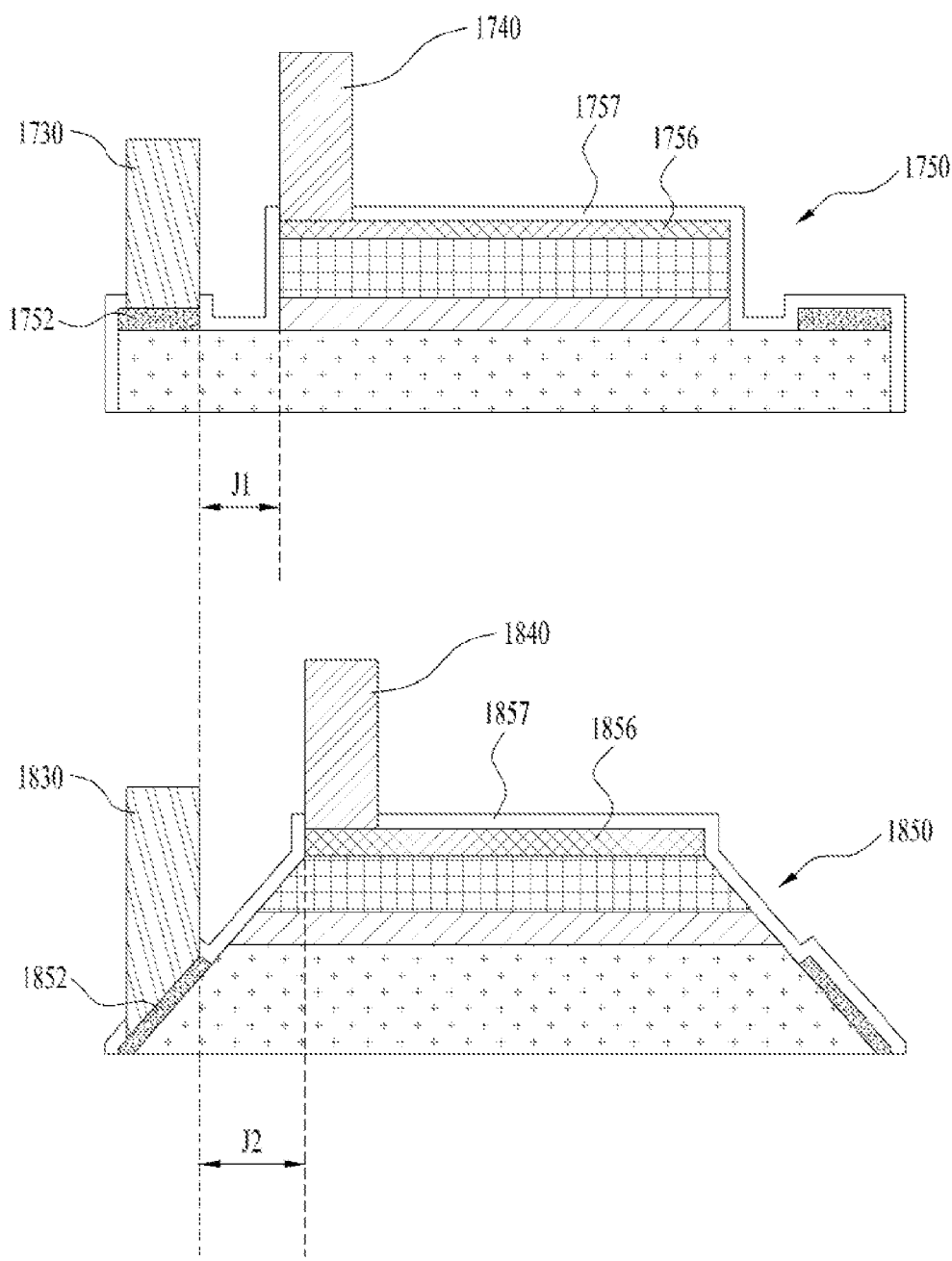
FIG. 19 shows cross-sectional diagrams comparatively illustrating a distance between wiring electrodes formed on the semiconductor light emitting element according to the present disclosure and a distance between wiring electrodes formed on the semiconductor light emitting element having the conventional structure.

FIG. 19 shows cross-sectional diagrams comparatively illustrating a distance between wiring electrodes formed on the semiconductor light emitting element according to the present disclosure and a distance between wiring electrodes formed on the semiconductor light emitting element having the conventional structure.

As shown in FIG. 19, a first wiring electrode 1730 may be formed on a first conductivity-type electrode 1752 of the semiconductor light emitting element 1750 having the conventional structure, and a second wiring electrode 1740 may be formed on a second conductivity-type electrode 1756 of the semiconductor light emitting element 1750 having the conventional structure. After a passivation layer 1757 configured to surround the first conductivity-type electrode 1752 and the second conductivity-type electrode 1756 is removed from some regions by etching, the wiring electrodes 1730 and 1740 are formed on the regions exposed by etching.

Further, the semiconductor light emitting element 1750 having the conventional structure is formed such that the side surface of an active layer thereof is vertical to the stacking direction of the semiconductor light emitting element. Further, a second conductivity-type semiconductor layer and the second conductivity-type electrode 1756 may be sequentially formed to overlap the active layer. The second conductivity-type electrode 1756 is formed in a comparatively large area in proportion to the area of the active layer, and thus, the second wiring electrode 1740 may be formed at an arbitrary point on the upper surface of the second conductivity-type electrode 1756.

FIG. 19 shows the cross-sectional diagram of the semiconductor light emitting element 1750 having the conventional structure in case that the first wiring electrode 1730 and the second wiring electrode 1740 are formed to be spaced apart from each other by a minimum distance J1.

The minimum distance J1 should be a distance over a technical limit at which different wiring electrodes may be formed separately, and should be greater than an assembly error range which may occur during self-assembly of the semiconductor light emitting element 1750. An assembly error is an error occurring due to a difference between the width of an assembly recess and the width of a semiconductor light emitting element when the semiconductor light emitting element is assembled with the assembly recess of an assembly substrate. For example, when the width of the semiconductor light emitting element is 50 μm and the width of the assembly recess is 55 μm, an assembly error of 5 μm at maximum may occur. In the semiconductor light emitting element in which the assembly error of 5 μm occurs, when the minimum distance J1 is less than 5 μm, a short-circuit defect between the wiring electrodes 1730 and 1740 may occur during a subsequent process of forming the wiring electrodes 1730 and 1740 after assembly. Thereby, the semiconductor light emitting element 1750 cannot be normally operated.

Accordingly, a longer distance between the wiring electrodes formed to drive the semiconductor light emitting element is more advantageous, and, in order to increase the distance between the wiring electrodes, a distance between the first conductivity-type electrode and the second conductivity-type electrode on which wiring electrodes are positioned needs to be increased. The distance between the first conductivity-type electrode and the second conductivity-type electrode may serve as the minimum distance between the wiring electrodes.

In a general semiconductor light emitting element, the size of the semiconductor light emitting element is reduced, and thus, the distance between a first conductivity-type electrode and a second conductivity-type electrode is reduced. Therefore, it is difficult to form wiring electrodes without occurrence of a short-circuit defect.

A method for increasing a distance between a first conductivity-type electrode and a second conductivity-type electrode by reducing the area of the second conductivity-type electrode formed to overlap an active layer by reducing the area of the active layer may be considered, but this method is disadvantageous in that an emission area is reduced as much as the reduced area of the active layer.

Meanwhile, in case of the semiconductor light emitting element 1850 according to the present disclosure shown in FIG. 19, a first wiring electrode 1830 may be formed on a first conductivity-type electrode 1852, and a second wiring electrode 1840 may be formed on a second conductivity-type electrode 1856. After a passivation layer 1857 configured to surround the first conductivity-type electrode 1852 and the second conductivity-type electrode 1856 is removed from some regions by etching, the wiring electrodes 1830 and 1840 are formed on the regions exposed by etching.

Specifically, the semiconductor light emitting element 1850 according to the present disclosure has the same size as the semiconductor light emitting element 1750 having the conventional structure, and the first wiring electrode 1830 is formed on the first conductivity-type electrode 1852. Further, the second wiring electrode 1840 is formed on the second conductivity-type electrode 1856.

FIG. 19 shows the cross-sectional diagram of the semiconductor light emitting element 1850 according to the present disclosure in case that the first wiring electrode 1730 and the second wiring electrode 1740 are formed at a minimum distance J2.

As shown in FIG. 19, the semiconductor light emitting element 1850 according to the present disclosure may have an active layer having an inclined side surface part, and the upper and lower surfaces of the active layer may have different widths depending on the inclination angle of the side surface part thereof. Here, the active layer is the same as the active layer 1854 shown in FIG. 17. That is, the distance between the first conductivity-type electrode 1852 and the second conductivity-type electrode 1856 may be adjusted depending on the inclination angle of the side surface part.

Further, compared to the semiconductor light emitting element 1750 having the conventional structure in which the side surface of the active layer forms a vertical stepped part, the semiconductor light emitting element 1850 according to the present disclosure may increase the minimum distance between the first conductivity-type electrode 1852 and the second conductivity-type electrode 1856 through the inclined side surface part.

Therefore, as shown in FIG. 19, the semiconductor light emitting element 1850 according to the present disclosure may have the long distance between the wiring electrodes, compared to the semiconductor light emitting element 1850 having the conventional structure and the same size (i.e., the width of the lower part thereof) as the semiconductor light emitting element 1850 according to the present disclosure.

Further, as shown in FIG. 19, the semiconductor light emitting element 1850 according to the present disclosure may have the width of the lower surface of the active layer which is greater than the width of the active layer of the semiconductor light emitting element 1750 having the conventional structure, and is thus advantageous in that it has a large emission area.

Figure 20:
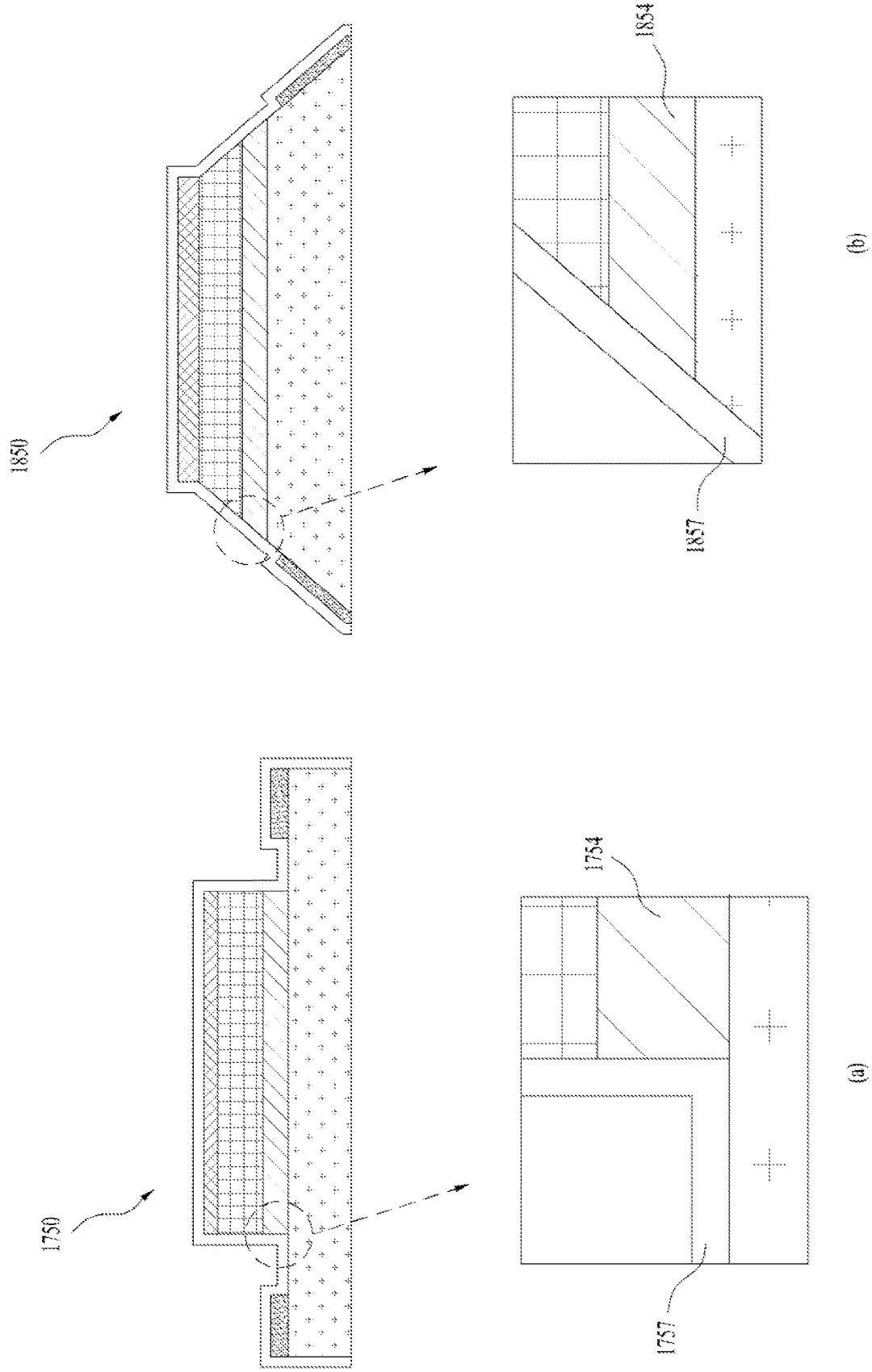
FIG. 20 shows cross-sectional diagrams comparatively illustrating the shapes of passivation layers which surround respective active layers of the semiconductor light emitting element having the conventional structure and the semiconductor light emitting element according to the present disclosure.

FIG. 20 shows cross-sectional diagrams comparatively illustrating the shapes of the passivation layers which surround the respective active layers of the semiconductor light emitting element having the conventional structure and the semiconductor light emitting element according to the present disclosure.

As shown in FIG. 20(a), the semiconductor light emitting element 1750 having the conventional structure is configured such that the side surface part of the active layer 1754 is formed to be vertical to the stacking direction of the semiconductor light emitting element 1750. Therefore, the side surface part of the active layer 1754 forms a stepped part with the first conductivity-type semiconductor layer and, when the passivation layer 1757 is formed on the side surface part of the active layer 1754, step coverage may be poor. Step coverage indicates a degree of maintenance of a constant thickness of a film on an uneven surface when the film is formed to surround the uneven surface.

On the other hand, as shown in FIG. 20(b), the semiconductor light emitting element 1850 according to the present disclosure is configured such that the side surface part of the active layer 1854 is formed to be inclined. Therefore, when the passivation layer 1857 is formed on the inclined side surface part of the active layer 1854, excellent step coverage may be acquired compared to the side surface part of the conventional active layer 1754 having the stepped part with the first conductivity-type semiconductor layer.

In general, step coverage of a passivation layer configured to surround the outer surface of a semiconductor light emitting element affects luminous efficacy. Particularly, a defect easily occurs in the side surface part of an active layer when the semiconductor light emitting element is manufactured on a growth substrate. Such a defect may remove or absorb photons generated by the active layer, when the semiconductor light emitting element is driven, thereby reducing luminous efficacy of the semiconductor light emitting element. In order to prevent such reduction in luminous efficacy, the passivation layer having a designated thickness or more may be formed to surround the side surface part of the active layer, thereby being capable of mitigating the defect of the side surface part of the active layer.

Therefore, the semiconductor light emitting element 1850 having the inclined side surface part, as shown in FIG. 20(b), has a structure in which the passivation layer is advantageously uniformly formed on the side surface part of the active layer of the semiconductor light emitting element 1850, thereby being capable of minimizing reduction in luminous efficacy due to a defect.

The passivation layer is generally formed of a material, such as $SiO_2$ or $SiN_x$, or otherwise, it may be formed of amorphous Silicone (a-Si) so as to reduce the deposition thickness of the passivation layer.

Since a-Si has excellent passivation performance compared to $SiO_2$ or $SiN_x$, a-Si may secure the same passivation performance as $SiO_2$ or $SiN_x$ even though a-Si is deposited to a smaller thickness than $SiO_2$ or $SiN_x$. For example, $SiO_2$ should be formed to have a thickness of 500 nm or more so as to serve as the passivation layer of the semiconductor light emitting element, but a-Si may have a thickness of only about 30 nm so as to serve as the passivation layer of the semiconductor light emitting element, and may thus greatly reduce process time taken to form the passivation layer.

Figure 21:
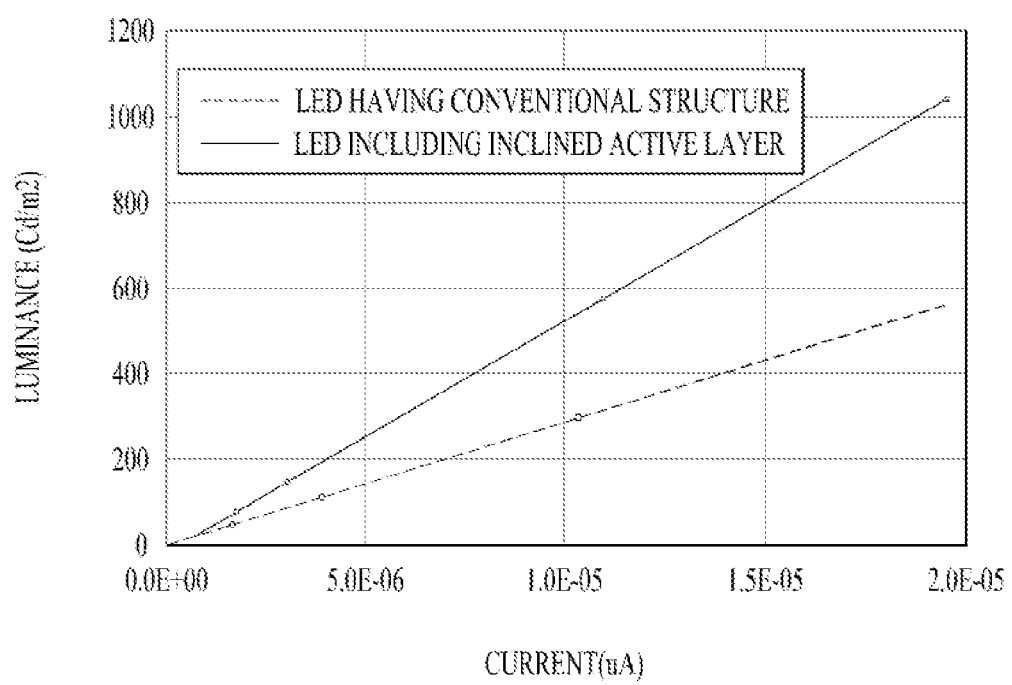
FIG. 21 is a graph representing a luminance difference between the semiconductor light emitting element having the conventional structure and the semiconductor light emitting element according to the present disclosure.

FIG. 21 is a graph representing a luminance difference between the semiconductor light emitting element having the conventional structure and the semiconductor light emitting element according to the present disclosure.

As shown in FIG. 21, compared to the semiconductor light emitting element (i.e., LED) having the conventional structure, the semiconductor light emitting element (i.e., LED) having the inclined active layer according to the present disclosure exhibits high luminance at the same current value. In other words, in order to generate the same current value, the semiconductor light emitting element having the conventional structure requires a larger emission area than the semiconductor light emitting element according to the present disclosure, and this means that the semiconductor light emitting element having the conventional structure should be manufactured to have a larger size.

On the other hand, the semiconductor light emitting element according to the present disclosure may emit light also through the inclined side surface part of the active layer, and may thus secure higher luminance than the semiconductor light emitting element of the same size having the conventional structure.

The above description is merely illustrative of the technical spirit of the present disclosure, and it will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure, and the scope of the technical spirit of the present disclosure is not limited by these embodiments.

The scope of protection of the present disclosure should be interpreted by the claims below, and all technical ideas within the scope equivalent thereto should be construed as being included in the scope of the present disclosure.

What is claimed is:

1. A display device, comprising:
   a substrate;
   assembly electrodes located on the substrate;
   an insulating layer located on the assembly electrodes;
   a partition wall located on the insulating layer and shaped to define an assembly recess; and
   a semiconductor light emitting element assembled with the assembly recess of the partition wall;
   wherein the semiconductor light emitting element comprises:
   a first conductivity-type semiconductor layer having a first side inclination angle;
   a second conductivity-type semiconductor layer having a second side inclination angle and being located on the first conductivity-type semiconductor layer; and
   an active layer having a third side inclination angle and disposed between the first conductivity-type semiconductor layer and the second conductivity-type semiconductor layer.

2. The display device of claim 1, wherein the second side inclination angle and the third side inclination angle are equal.

3. The display device of claim 2, wherein a first area of the first conductivity-type semiconductor layer is greater than a second area of the second conductivity-type semiconductor layer.

4. The display device of claim 3, wherein the semiconductor light emitting element further comprises:
   a first conductivity-type electrode located on an inclined side surface of the first conductivity-type semiconductor layer having the first side inclination angle; and
   a second conductivity-type electrode located on the second conductivity-type semiconductor layer.

5. The display device of claim 4, wherein the semiconductor light emitting element further comprises a passivation layer shaped to surround an inclined side surface of the active layer having a third conductivity-type semiconductor layer.

6. The display device of claim 5, wherein the passivation layer is formed of amorphous Silicon (a-Si).

7. The display device of claim 2, wherein the first side inclination angle and the third side inclination angle are equal.

8. The display device of claim 2, wherein the first side inclination angle is greater than the third side inclination angle.

9. The display device of claim 5, further comprising a first wiring electrode located on the first conductivity-type electrode,
   wherein the first wiring electrode is electrically connected to the substrate.

10. The display device of claim 9, wherein:
    the substrate comprises a transistor configured to drive an active matrix; and
    the first conductivity-type electrode is electrically connected to the transistor.

11. The display device of claim 1, wherein the semiconductor light emitting element is a micro Light Emitting Diode (micro-LED) that has a length and width that are each 80 micrometers or less.

* * * * *